US009208855B2

United States Patent
Lee

(10) Patent No.: US 9,208,855 B2
(45) Date of Patent: *Dec. 8, 2015

(54) WEAK BIT COMPENSATION FOR STATIC RANDOM ACCESS MEMORY

(71) Applicant: TAIWAN SEMICONDUCTOR MANUFACTURING COMPANY, LTD., Hsinchu (TW)

(72) Inventor: Cheng Hung Lee, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 44 days.

This patent is subject to a terminal disclaimer.

(21) Appl. No.: 13/660,212

(22) Filed: Oct. 25, 2012

(65) Prior Publication Data

US 2013/0051130 A1  Feb. 28, 2013

Related U.S. Application Data

(63) Continuation of application No. 12/704,710, filed on Feb. 12, 2010, now Pat. No. 8,325,510.

(51) Int. Cl.
*G11C 11/00* (2006.01)
*G11C 7/00* (2006.01)
*G11C 8/00* (2006.01)
*G11C 11/417* (2006.01)

(52) U.S. Cl.
CPC ................... *G11C 11/417* (2013.01)

(58) Field of Classification Search
USPC ......... 365/154, 156, 203, 204, 233.1, 189.11, 365/207
See application file for complete search history.

(56) References Cited

U.S. PATENT DOCUMENTS

| 6,172,901 | B1 * | 1/2001 | Portacci ................ 365/154 |
| 6,504,788 | B1 * | 1/2003 | Nii et al. .............. 365/154 |
| 6,542,426 | B2 | 4/2003 | Jung et al. |
| 6,834,007 | B2 * | 12/2004 | Takemura ............. 365/154 |
| 6,867,628 | B2 | 3/2005 | Cho et al. |
| 6,982,899 | B2 * | 1/2006 | Sumitani et al. ....... 365/154 |
| 7,106,620 | B2 | 9/2006 | Chang et al. |
| 7,123,504 | B2 | 10/2006 | Yabe |
| 7,136,296 | B2 | 11/2006 | Luk et al. |
| 7,301,793 | B2 | 11/2007 | Kanehara et al. |
| 7,304,884 | B2 * | 12/2007 | Sugahara et al. ....... 365/154 |
| 7,400,523 | B2 | 7/2008 | Houston |
| 7,400,524 | B2 | 7/2008 | Otsuka |
| 7,489,539 | B2 * | 2/2009 | Nii .................... 365/154 |

(Continued)

FOREIGN PATENT DOCUMENTS

CN  1808621  7/2006

OTHER PUBLICATIONS

Office Action dated Sep. 4, 2012 from corresponding application No. CN 201010227887.

*Primary Examiner* — Trong Phan
(74) *Attorney, Agent, or Firm* — Hauptman Ham, LLP

(57) ABSTRACT

A static random access memory (SRAM) is provided. The SRAM includes a data line, a data line bar, and a current path block. The current path block includes at least two transistors configured to provide a current path for the data line in transition from a first logic voltage to a second logic voltage, wherein the current path block is connected to the data line and the data line bar during an entire duration of operation of the SRAM.

20 Claims, 6 Drawing Sheets

(56) References Cited

U.S. PATENT DOCUMENTS

| | | |
|---|---|---|
| 7,492,626 B2 * | 2/2009 | Chanussot et al. ............ 365/154 |
| 7,606,060 B2 | 10/2009 | Chan et al. |
| 7,742,326 B2 | 6/2010 | Houston |
| 7,764,557 B2 | 7/2010 | Kim |
| 7,826,251 B2 | 11/2010 | Chang et al. |
| 7,983,071 B2 | 7/2011 | Houston |
| 8,050,113 B2 | 11/2011 | Byeon |
| 8,072,798 B2 | 12/2011 | Takeyama |
| 8,208,314 B2 * | 6/2012 | Zimmerman ................ 365/154 |
| 8,259,510 B2 * | 9/2012 | Chuang et al. ................ 365/154 |
| 8,379,436 B2 * | 2/2013 | Kawasumi .................... 365/156 |
| 8,493,774 B2 * | 7/2013 | Kuang et al. ................. 365/156 |
| 8,559,247 B2 * | 10/2013 | Shiu ......................... 365/189.11 |
| 2005/0047235 A1 | 3/2005 | Noh |
| 2009/0154278 A1 | 6/2009 | Chan et al. |

\* cited by examiner

WEAK BIT COMPENSATION FOR STATIC RANDOM ACCESS MEMORY

RELATED APPLICATIONS

The present application is a continuation application of U.S. application Ser. No. 12/704,710, U.S. Pat. No. 8,325,510, entitled "Weak Bit Compensation for Static Random Access Memory", filed Feb. 12, 2010, which is hereby incorporated by reference in its entirety.

TECHNICAL FIELD

The present disclosure relates generally to integrated circuits, more particularly to a static random access memory.

BACKGROUND

Static random access memory (SRAM) tends to have aggressive design rules to reduce the size of devices and increase the capacity in the system on chip (SoC) solutions, and therefore subject to more process variations. Device variations worsen as voltage decreases because there is less headroom at lower voltages.

The cell current of a weak bit can affect and degrade the performance of SRAM. A weak bit is a memory cell that has a relatively low current capacity as compared to a normal bit due to process/device variations. The weak bit results in a slow response time and affects the performance of SRAM. In particular, a weak bit affects the speed and the minimum power supply voltage of a single ended SRAM design. For example, a weak bit's cell current can have more than 30% lower current capacity compared to a normal bit due to process/device variations, and the speed can also degrade more than 30%.

Accordingly, new methods are desired to solve the above problems.

SUMMARY

In one embodiment, a static random access memory (SRAM) includes a data line, a data line bar, and a current path block. The current path block includes at least two transistors configured to provide a current path for the data line in transition from a first logic voltage to a second logic voltage, wherein the current path block is connected to the data line and the data line bar during an entire duration of operation of the SRAM.

In another embodiment, a static random access memory (SRAM) includes a plurality of memory cells. Each memory cell of the plurality of memory cells is connected to a data line, a data line bar, and a current path block. The current path block includes at least two transistors configured to provide a current path for the data line in transition from a first logic voltage to a second logic voltage, wherein the current path block is connected to the data line and the data line bar during an entire period of operation.

In yet another embodiment, a method of reading data from a static random access memory (SRAM) includes activating a memory cell of the SRAM using a word line signal. The method further includes transferring data from the memory cell to a data line and a data line bar. The method further includes activating a current path block including at least two transistors, wherein the current path block is connected to the data line and the data line bar during an entire duration of operation, and a gate of a first transistor of the at least two transistors is connected to a pulse signal, the pulse signal has a rising edge not earlier than a rising edge of the word line signal. The method further includes transitioning the data line from a first logic voltage to a second logic voltage.

These and other embodiments of the present disclosure, as well as its features are described in more detail in conjunction with the text below and attached figures.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the invention.

Figure 1A:
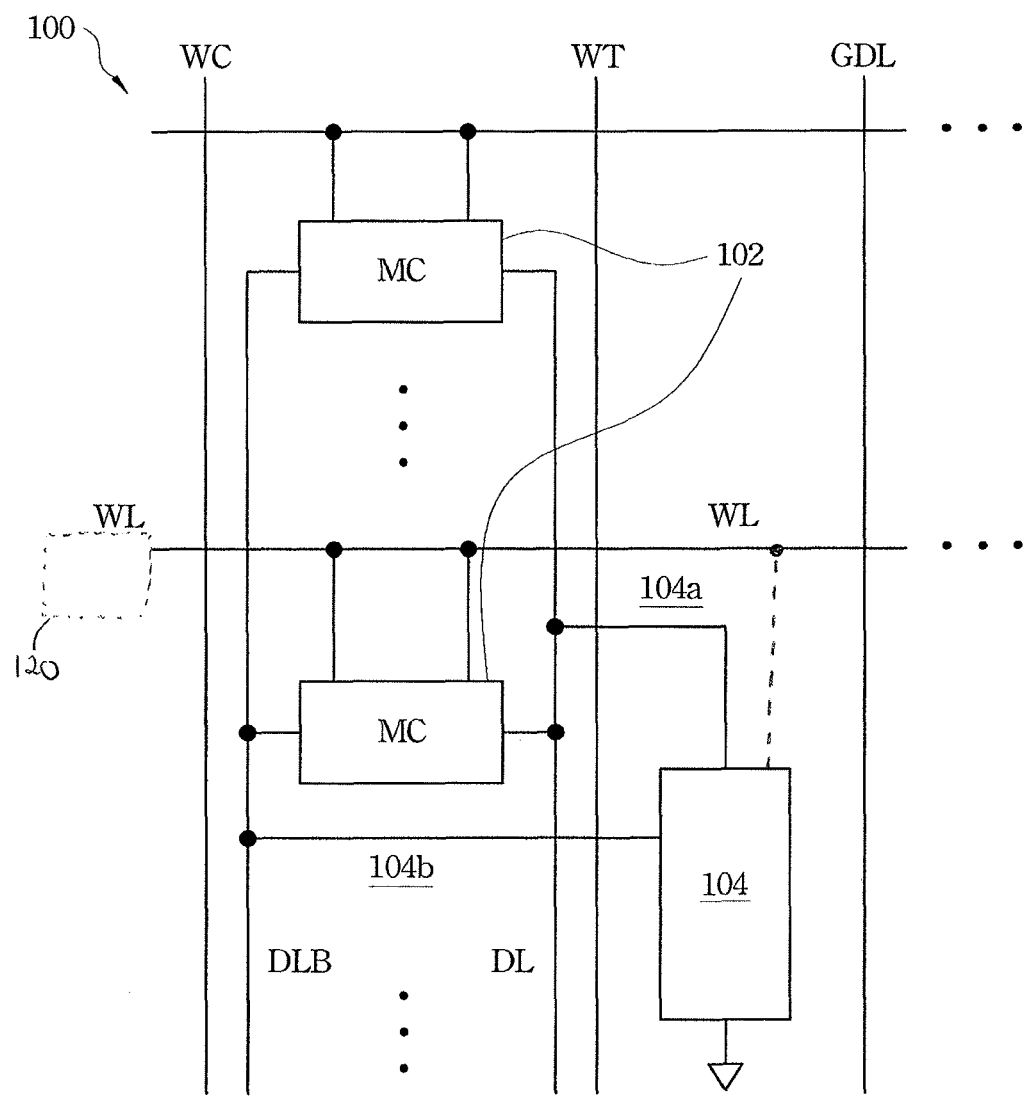
FIG. 1A illustrates an exemplary circuit of a static random access memory (SRAM) in an integrated circuit.

FIG. 1A illustrates an exemplary circuit of a static random access memory (SRAM) in an integrated circuit. The SRAM circuit 100 includes memory cells (MC) 102 and a current path block 104. In some embodiments, a portion of memory cells 102 can be weak bits if they have relatively low current capacity compared to a normal bit from process/device variations. DL denotes a data line, DLB denotes a data line bar, WL denotes a word line, SEGD denotes a precharge signal, WT denotes a write data signal, WC denotes a WT bar signal, and GDL denotes a global data line, all of which are commonly known in the art.

In FIG. 1A, the current path block 104 provides a current path to speed up the DL in transitioning from a first logic voltage, e.g., a high logic voltage, to a second logic voltage, e.g., a low logic voltage. In a transition from a high logic voltage to a low logic voltage, the current path block 104 provides another current discharge (or pull down) path in addition to a conventional discharge path of the memory cell 102, which makes the transition that much faster. The current path block 104 is connected to the DL at 104*a* and to the DLB at 104*b*. In one example, the DL can be referred as a bit line, and the DLB can be referred to as a bit line bar. The operation of the current path block 104 with the SRAM circuit 100 is further explained below with an embodiment shown in FIG. 2 and illustrative waveforms in FIG. 3.

Figure 1B:
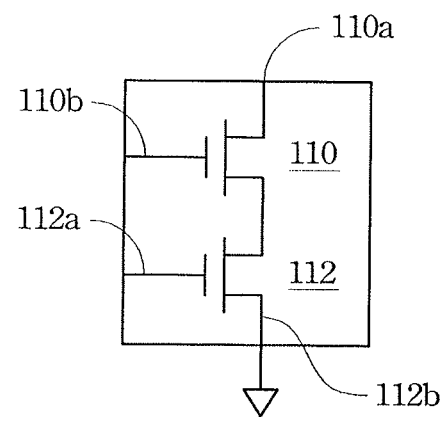
FIG. 1B illustrates an exemplary current path block that is used in the circuit shown in FIG. 1A.

FIG. 1B illustrates an exemplary current path block that can be used in the circuit shown in FIG. 1A. The circuit in FIG. 1B includes two cascade NMOS transistors 110 and 112. In one example, the drain 110*a* of the NMOS transistor 110 is connected to the DL to speed up the DL in transitioning from a first logic voltage, e.g., a high logic voltage, to a second logic voltage, e.g., a low logic voltage, by providing another current discharge (or pull down) path in addition to a conventional discharge path of the memory cell 102. In some embodiments, one of the gates of NMOS transistors 110 and 112, e.g., 110b or 112a, can be connected to the DLB. The other gate, e.g., 112a or 110b can be connected to a pulse signal that is provided from a clock tree 120 that also provides the WL signal, e.g., a word line pulse generator. In other embodiments, the pulse signal can have a delay of zero or even number of logic gates compared to a WL pulse signal, or the same as a clock rising path delay. The source 112b of the NMOS transistor 112 is connected to a ground. The DLB and the pulse signal will control the current path block 104 to enable or disable the current path.

For example, the NMOS transistors 110 and 112 will be turned on to provide a current path from the DL (connected to the drain 110a of the NMOS transistor 110) to the ground (connected to the source 112b of the NMOS transistor 112) only when both the DLB and the pulse signal have a high logic voltage (or at least above the threshold voltage of the NMOS transistors 110 and 112). If any one of those signals (i.e., DLB and pulse signal) has a low logic voltage (or below the threshold voltage of the NMOS transistors 110 and 112), the NMOS transistor 110 and/or 112 connected to the low logic voltage will be turned off and the current path block 104 is disabled.

Figure 1C:
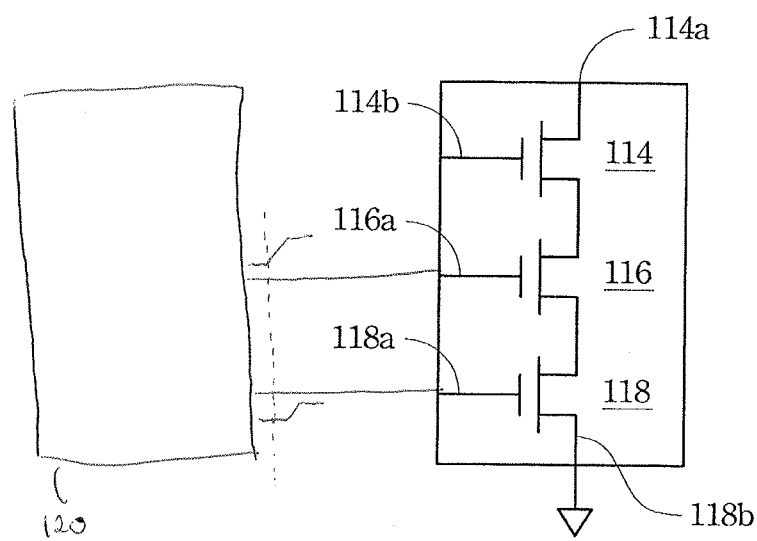
FIG. 1C illustrates another exemplary current path block that is used in the circuit shown in FIG. 1A.

FIG. 1C illustrates another exemplary current path block that can be used in the circuit shown in FIG. 1A. The circuit in FIG. 1C includes three NMOS transistors 114, 116, and 118. In one example, the drain 114a of the NMOS transistor 114 is connected to the DL to speed up the DL in transitioning from a first logic voltage, e.g., a high logic voltage, to a second logic voltage, e.g., a low logic voltage, by providing another current discharge (or pull down) path in addition to a conventional discharge path of the memory cell 102. In some embodiments, one of the gates of NMOS transistors 114, 116, and 118, e.g., 114b, 116a, or 118a, can be connected to the DLB. The other two gates of NMOS transistors 114, 116, and 118 can be connected to separate pulse signals. In this example, the current path block 102 is enabled when all signals (i.e., DLB and two separate pulse signals) have a high logic voltage. The pulse signals can be provided from a clock tree 120 that also provides the WL signal, e.g., from a word line pulse generator. As mentioned above, both the DLB and the pulse signals will control the current path block 104 to enable or disable it.

Figure 2:
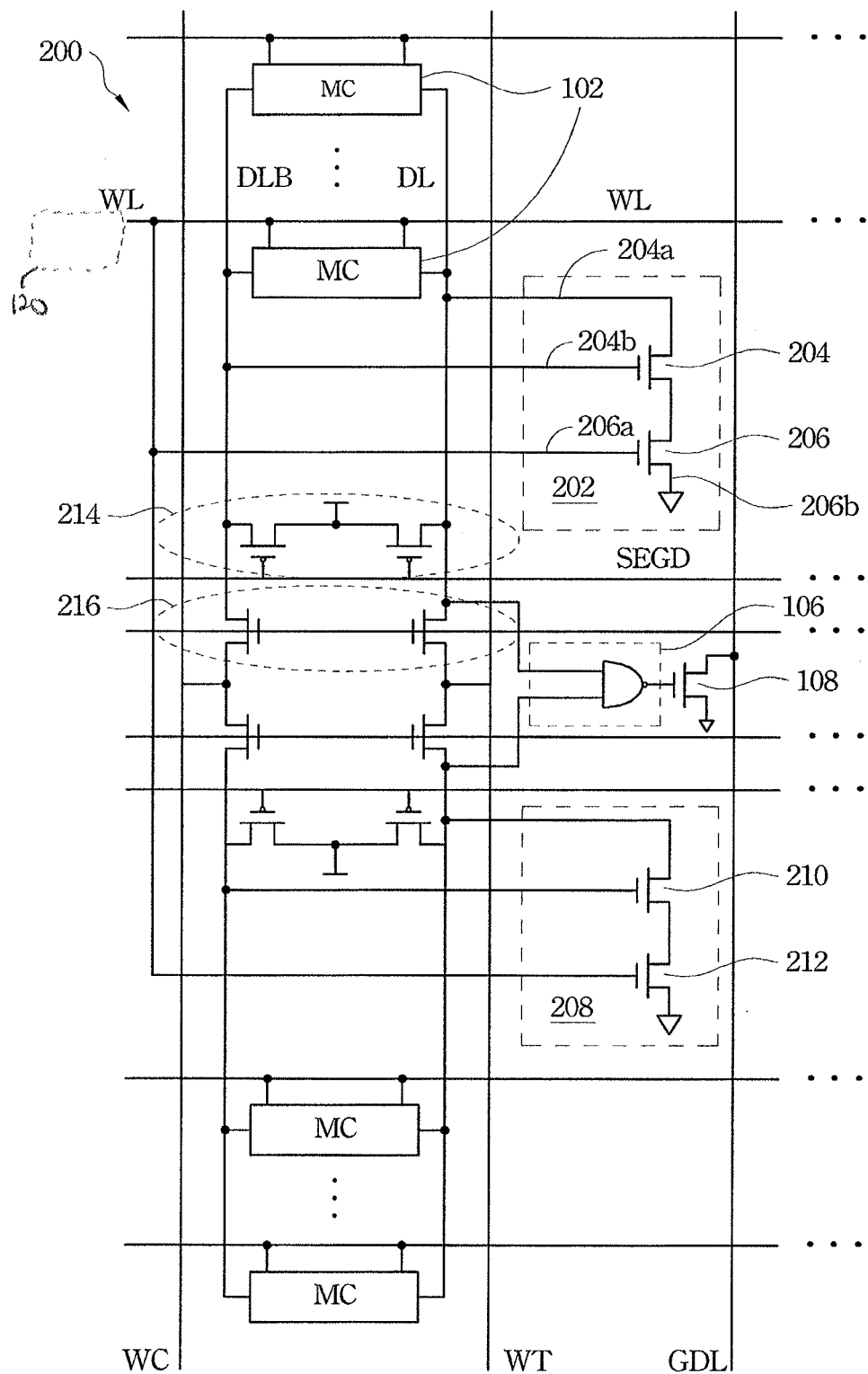
FIG. 2 illustrates an exemplary embodiment of a static random access memory (SRAM) of FIG. 1A.

FIG. 2 illustrates an exemplary embodiment of a static random access memory (SRAM) of FIG. 1A. The SRAM circuit 200 includes memory cells 102 and current path blocks 202 and 208 (corresponding to the current path block 104 in FIG. 1). A data line precharge block 214 and write pass gate block 216 are also shown. The data line precharge block 214 precharges the data line DL and DLB in read/write operations. The write pass gate block 216 is used in write operations. In FIG. 2, the DL is connected to the single ended sense amplifier 106 that is in turn coupled to the GDL through a pull down NMOS transistor 108. The sense amplifier 106 detects the stored information of the memory cell 102 in a read operation. The pull down NMOS transistor 108 pulls down the GDL when reading a "0" from the memory cell 102.

In embodiments, multiple memory cells 102 can share the current path block 202. In one example, about 10-1000 memory cells 102 can share one current path block 202, depending on the design of the SRAM 200. The cascade NMOS transistors 204 and 206 of the current path block 202 are connected to the DL and the DLB. More particularly, the drain 204a of the NMOS transistor 204 is connected to the DL. The gate 204b of the NMOS transistor 204 is connected to the DLB. The source 206b of the NMOS transistor 206 is connected to the ground. The gate 206a of the NMOS transistor 206 is connected to the pulse signal, e.g., the WL.

In some embodiments, the pulse signal, e.g. for the gate of the NMOS transistor 206, can be provided from a clock tree 120 that also provides the WL signal. Also, the pulse signal can have certain conditions, e.g. to be within the WL signal period. For example, the pulse signal can have a rise edge not earlier than the WL signal. Also, the pulse signal can have a falling edge not later than the WL signal. The pulse signal can rise and fall within one clock period.

The DLB and the WL enables the current path block 202. For example, the current path block 202 is enabled when both the NMOS transistors 204 and 206 are turned on. Therefore, when the DLB and the WL are in a high logic voltage (or at least above the threshold voltage of the NMOS transistors 204 and 206), the current path block 202 is enabled to speed up the DL in transitioning from a high logic voltage to a low logic voltage, by providing another current discharge (or pull down) path in addition to a conventional discharge path of the memory cell 102. The functions and connections of NMOS transistors 210 and 212 of the current path block 208 are similar to the NMOS transistors 204 and 206 of the current path block 202. The operation of the current path blocks 202 and/or 208 with the SRAM circuit 200 is further explained with illustrative waveforms in FIG. 3 below.

Figure 3:
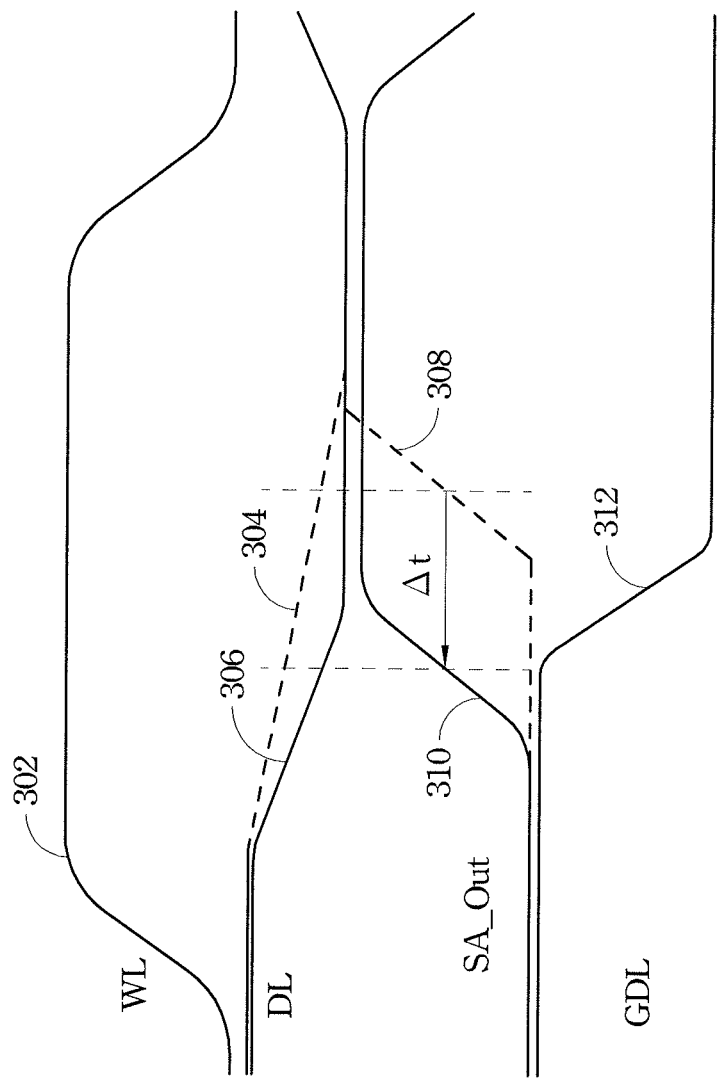
FIG. 3 illustrates waveforms of an exemplary static random access memory (SRAM) of FIG. 2.

FIG. 3 illustrates waveforms of an exemplary static random access memory (SRAM) of FIG. 2. The WL waveform 302 shows a pulse with transitions from a low voltage to a high voltage and back to a low voltage. In this example, WL is asserted (e.g., WL has a high voltage) to access the memory cell 102, e.g., for a read operation. The DL waveforms 304 and 306 show a transition from a high voltage to a low voltage. This transition can happen, for example, when the memory cell bit stores a "0" and the bit information is accessed for a read operation. The dotted line waveform 304 of DL shows the transition of a weak bit, e.g., 102, without using the current path block 202. It has a slow response due to limited current capacity. The continuous line waveform 306 of DL shows the transition of the weak bit cell, e.g., 102, using the current path block 202. It has a faster response by using the current path block 202. In an extreme case of the weak bit, e.g., 102, without the current path block 202, the DL may never make a transition from a high voltage to a low voltage due to an extremely limited current capacity.

The sense amplifier output waveform SA_Out in a dotted line 308 of the weak bit without the current path block 202 shows a delayed transition from a low voltage to a high voltage. This is due to the slow response of the waveform DL in dotted line 304 when the current path block 202 is not used. The sense amplifier output waveform SA_Out in continuous line 310 of the weak bit using the current path block 202 shows a faster transition from a low voltage to a high voltage. Due to the faster response of a weak bit with the help of the current path block 202, the response time of the sense amplifier output improved by the time difference Δt. The transition of the SA_Out waveform 310, e.g., from a low voltage to a high voltage, is followed by the transition of the GDL waveform 312, e.g., from a high voltage to a low voltage. In one embodiment, about 20% speed improvement is achieved by using the current path block 202 when compared with a conventional circuit without the current path block 202.

Figure 4:
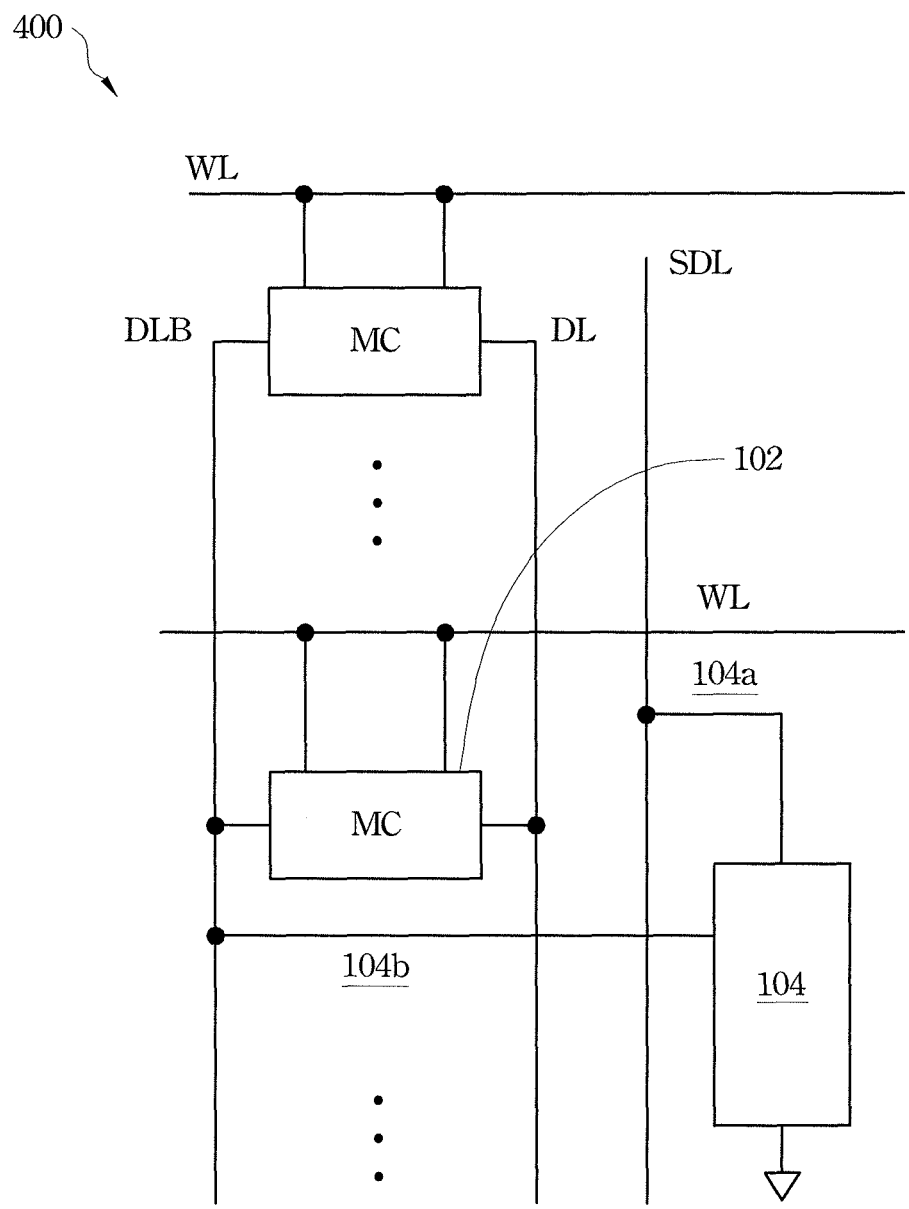
FIG. 4 illustrates another exemplary circuit of a static random access memory (SRAM) in an integrated circuit.

FIG. 4 illustrates another exemplary circuit of a static random access memory (SRAM) in an integrated circuit. In the SRAM circuit 400, there is a single-ended data line SDL in addition to the DL and DLB. The SDL is used in a read operation from the memory cell 102. In some embodiments, the current path block 104 can be also used in the circuit 400 by connecting the SDL instead of the DL to the current path block 104 at 104a. The functions and the other connections of the current path block 104 are similar to the circuits shown in FIG. 1A or FIG. 2. Further, the current path block 104 can be used in a 6 T, 8 T, or 10 T bit cell, or other various SRAM designs.

Even though embodiments of the disclosure are described in the above using NMOS transistors for the current path block 104, it is noted that an inverse function/logic can be implemented using PMOS transistors, e.g., "pull up" instead of "pull down". A skilled person in the art will appreciate that there can be many embodiment variations of this disclosure.

Figure 5:
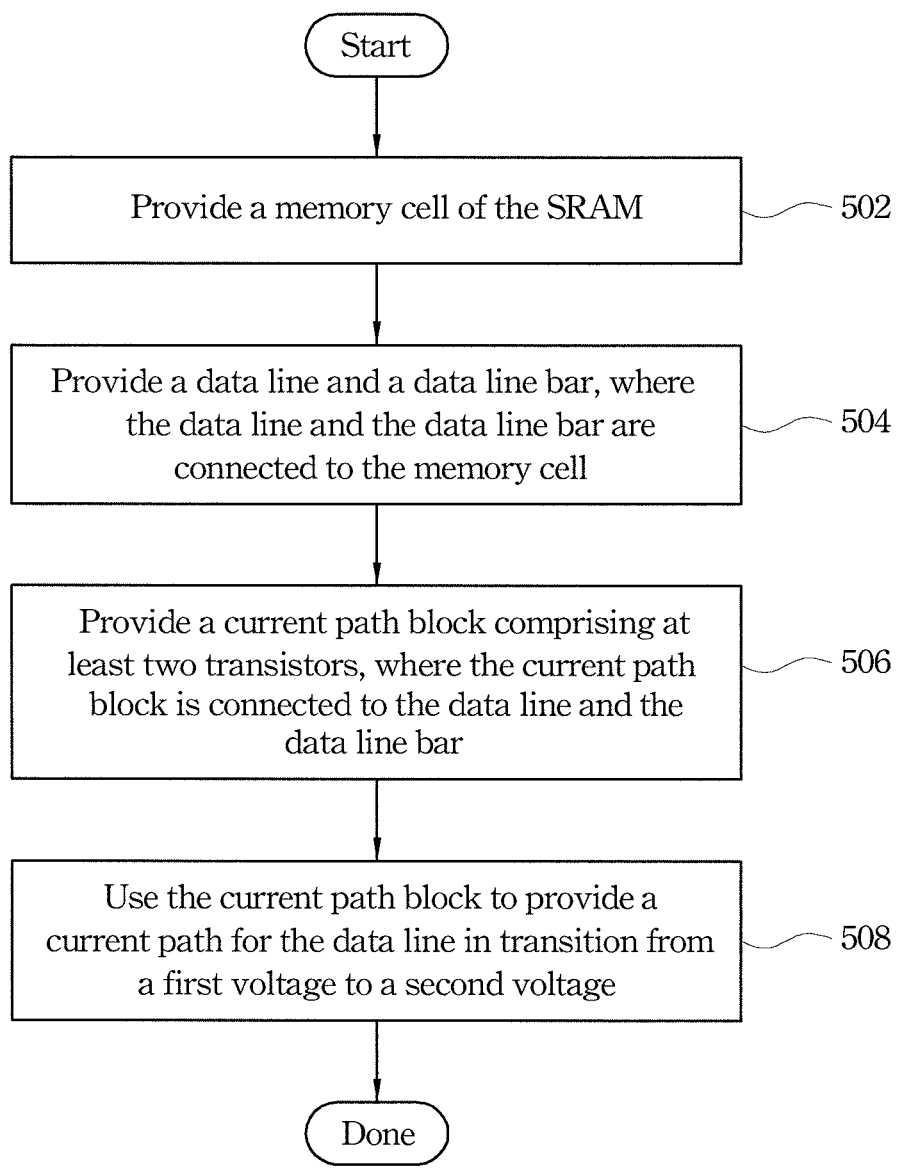
FIG. 5 illustrates an exemplary method for a static random access memory (SRAM) of FIG. 1A.

FIG. 5 illustrates an exemplary method for a static random access memory (SRAM) of FIG. 1A. At step 502, a memory cell 102 of the SRAM is provided. At step 504, a DL and a DLB are provided, where the DL and the DLB are connected to the memory cell 102. At step 506, the current path block 104 comprising at least two transistors is provided. The current path block 104 is connected to the DL and the DLB. At step 508, the current path block 104 is used to provide a current path for the DL in transition from a first logic voltage to a second logic voltage.

In some embodiments, the drain or source of a first transistor of at least two transistors can be connected to the DL. The first gate of one transistor of the at least two transistors can be connected to a DLB. The source or drain of a second transistor of the at least two transistors can be connected so that a current path is provided to a ground or a power supply.

Although the present disclosure and its advantages have been described in detail, it should be understood that various changes, substitutions and alterations can be made herein without departing from the spirit and scope of the disclosure. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the invention.

Each claim of this document constitutes a separate embodiment, and embodiments that combine different claims and/or different embodiments are within scope of the invention and will be apparent to those skilled in the art after reviewing this disclosure. Accordingly, the scope of the invention should be determined with reference to the following claims, along with the full scope of equivalents to which such claims are entitled.

What is claimed is:

1. A static random access memory (SRAM), comprising:
   a data line;
   a data line bar; and
   a current path block including at least two transistors configured to provide a current path for the data line in transition from a first logic voltage to a second logic voltage, a gate of a first transistor of the at least two transistors is connected to the data line bar, wherein the current path block is electrically connected to the data line and the data line bar during an entire duration of operation of the SRAM, the entire duration of operation of the SRAM including time periods where a memory cell associated with the current path block is not selected, and a gate of a second transistor of the at least two transistors is connected to a word line and is configured to receive a word line signal or a first pulse signal.

2. The SRAM of claim 1, wherein a gate of a third transistor of the at least two transistors is configured to receive a second pulse signal different than the first pulse signal and the word line signal.

3. The SRAM of claim 1, wherein the first pulse signal is delayed with respect to the word line signal.

4. The SRAM of claim 1, wherein the first logic voltage is a high logic voltage and the second logic voltage is a low logic voltage.

5. The SRAM of claim 1, wherein the first logic voltage is a low logic voltage and the second logic voltage is a high logic voltage.

6. The SRAM of claim 1, further comprising a precharge block configured to precharge the data line and the data line bar during a read operation or a write operation.

7. The SRAM of claim 1, further comprising:
   a sense amplifier connected to the data line; and
   a global bit line selectively connected to the sense amplifier.

8. The SRAM of claim 1, wherein the first transistor is connected to the data line and the data line bar during the entire period of operation.

9. A static random access memory (SRAM), comprising:
   a plurality of memory cells, wherein each memory cell of the plurality of memory cells is connected to:
      a data line;
      a data line bar; and
      a current path block including at least three transistors configured to provide a current path for the data line in transition from a first logic voltage to a second logic voltage, wherein a first transistor of the current path block is connected to the data line and the data line bar during an entire period of operation of the SRAM, the entire duration of operation of the SRAM including time periods where a memory cell associated with the current path block is not selected.

10. The SRAM of claim 9, wherein a gate of the first transistor of the at least three transistors is connected to the data line bar.

11. The SRAM of claim 10, wherein a gate of a second transistor of the at least three transistors is configured to receive a word line signal or a first pulse signal.

12. The SRAM of claim 11, wherein a gate of a third transistor of the at least three transistors is configured to receive a second pulse signal different than the first pulse signal and the word line signal.

13. The SRAM of claim 11, wherein the first pulse signal is delayed with respect to the word line signal.

14. The SRAM of claim 9, wherein the first logic voltage is a high logic voltage and the second logic voltage is a low logic voltage.

15. The SRAM of claim 9, wherein the first logic voltage is a low logic voltage and the second logic voltage is a high logic voltage.

16. The SRAM of claim 9, further comprising:
   a sense amplifier connected to the data line; and a global bit line selectively connected to the sense amplifier.

17. A method of reading data from a static random access memory (SRAM), the method comprising:
   activating a memory cell of the SRAM using a word line signal;
   transferring data from the memory cell to a data line and a data line bar;
   activating a current path block comprising at least two transistors, wherein a first transistor of the current path block is connected to the data line and the data line bar during an entire duration of operation, the entire duration of operation of the SRAM including time periods where a memory cell associated with the current path block is not selected, and a gate of a second transistor of the at least two transistors is connected to a pulse signal, the pulse signal has a rising edge not earlier than a rising edge of the word line signal; and
   transitioning the data line from a first logic voltage to a second logic voltage.

18. The method of claim 17, wherein activating the current path block further comprises activating the current path block based on a voltage on data line bar.

19. The method of claim 17, wherein transitioning the data line from the first logic voltage to the second logic voltage comprises transitioning the data line from a high logic voltage to a low logic voltage.

20. The method of claim 17, wherein transitioning the data line from the first logic voltage to the second logic voltage comprises transitioning the data line from a low logic voltage to a high logic voltage.

* * * * *